United States Patent [19]
Makita

[11] Patent Number: 5,499,259
[45] Date of Patent: Mar. 12, 1996

[54] SEMICONDUCTOR OPTICAL DEVICE WITH LIGHT CONTROLLING LAYER OF SUPER-LATTICE STRUCTURE

[75] Inventor: Kikuo Makita, Tokyo, Japan

[73] Assignee: NEC Corporation, Tokyo, Japan

[21] Appl. No.: 265,752

[22] Filed: Jun. 27, 1994

[30] Foreign Application Priority Data

Jun. 25, 1993 [JP] Japan ................... 5-154041

[51] Int. Cl.$^6$ .................................. H01S 3/18
[52] U.S. Cl. ................... 372/45; 372/20; 372/26
[58] Field of Search ................ 372/45, 20, 26; 357/22, 16

[56] References Cited

U.S. PATENT DOCUMENTS

| | | | |
|---|---|---|---|
| 4,861,130 | 8/1989 | Katsuyama et al. | 372/45 |
| 4,903,091 | 2/1990 | Baba et al. | 357/22 |
| 4,941,025 | 7/1990 | Tabatabaie | 357/16 |
| 5,048,049 | 9/1991 | Amann | 372/20 |
| 5,132,981 | 7/1992 | Uomi et al. | 372/45 |
| 5,155,620 | 10/1992 | Gordan et al. | 372/20 |

OTHER PUBLICATIONS

Yukio Noda et al., "High-Speed Electroabsorption Modulator with Strip-Loaded GaInAsP Planar Waveguide", *Journal of Lightwave Technology*, vol. LT-4, No. 10, Oct. 1986, pp. 1445–1452.

J. E. Zucker et al., "Miniature Mach-Zehnder InGaAsp Quantum Well Waveguide Interferometers for 1.3 μm", *IEEE Photonics Technology Letters*, vol. 1, No. 1, Jan. 1990, pp. 32–34.

H. Sano et al., "InGaAs/InAlAs MQW Optical Modulator", *Technical Reports of Electro-Information Communication Society*, OQE91-57, 1991, pp. 69–74 (with partial translation) (No Month).

Y. Sakata et al., "Novel tunable twin guide laser diodes with carrier control tuning layer", *Proceedings of the 1993 IEICE Spring Conference*, Mar. 28–31, 1993, Nagoya, Japan, pp. 4–202.

H. Kobayashi et al., "Electric-Field Dependent Optical Absorption in an InAlAs/InP Type II Superlattice", Extended Abstracts of the 1992 International Conference on Solid State Devices and Materials, 1992, pp. 255–256. (No Month).

J. E. Zucker et al., "Compact directional coupler switches using quantum well electrorefraction", Applied Physics Letters, No. 22, Nov. 27, 1989, pp. 2280–2282.

E. Yamamoto et al., "Optical modulation characteristics of a twin-guide laser by an electric field", Applied Physics Letters, No. 21, Nov. 18, 1991, pp. 2721–2723.

S. Li et al., "Electroabsorption in the type II superlattices", Applied Physics Letters, No. 16, Apr. 20, 1992, pp. 1969–1971.

S. Li et al., "Exitonic electroabsorption in the type II superlattices", Applied Physics Letters, No. 14, Oct. 5, 1992, pp. 1694–1696.

*Primary Examiner*—Rodney B. Bovernick
*Assistant Examiner*—Yisun Song
*Attorney, Agent, or Firm*—Sughrue, Mion, Zinn, Macpeak & Seas

[57] ABSTRACT

A semiconductor optical device such as a light modulator or a tunable laser emitting diode has either light absorbing/transmitting layer, light modulation layer or tuning layer responsive to an electric field for changing the intensity or the wavelength of an output light, and the light absorbing/transmitting layer, the light modulation layer or the tuning layer is implemented by a super-lattice structure formed by using a first compound semiconductor material and a second compound semiconductor material, wherein the second compound semiconductor material is larger in electron affinity as well as the total of electron affinity and energy band gap than the first compound semiconductor material so that a large extinction ratio or a wide variation in wavelength is achieved.

7 Claims, 12 Drawing Sheets

5,499,259

SEMICONDUCTOR OPTICAL DEVICE WITH LIGHT CONTROLLING LAYER OF SUPER-LATTICE STRUCTURE

FIELD OF THE INVENTION

This invention relates to a semiconductor optical device and, more particularly, to a semiconductor optical device such as a light modulator and a tunable laser emitting diode incorporated in an optical communication system.

DESCRIPTION OF THE RELATED ART

Conventionally, a light signal is directly modulated by a single-mode semiconductor laser device for transferring pieces of information through a long wavelength optical communication system. However, a modulation system separated from the semiconductor laser device is appropriate for a high-speed large-capacity optical transmission system, and the modulation system usually includes a light modulation device for imposing pieces of information on a carrier. A semiconductor tunable laser emitting device has been studied for a multiple wave transmission system.

Various light modulation devices have been proposed. However, an electro-absorption type and an electro-refraction type are attractive in view of the device size and the facility, and a large number of papers have reported these attractive points. One of the papers is entitled as "High-Speed Electroabsorption Modulator with Strip-Loaded GainAsP Planar Waveguid", IEEE Journal of Lightwave Technology, vol. LT-4, No. 10, October 1986, pages 1445–1452, and another paper is "Miniature Mach-Zehnder InGa sP Quantum well Waveguide Interferometers for 1.3 microns", IEEE Photonics Technology Letters, vol. 2, No. 1, January 1990, pages 32–34. Yet another paper is "InGaAs/ InAlAs MQW Optical Modulator", Technical Reports of Electro-Information Communication Society, OQE91-57, pages 69–74 (1991).

FIG. 1 illustrates a prior art semiconductor light modulation device 1 of the electro-absorption type coupled with a signal source 2, and the semiconductor light modulation device 1 has a light absorbing/transmitting layer 1a. The light absorbing/transmission layer 1a is formed of an intrinsic semiconductor material, and forms a pin structure.

In operation, the signal source 2 supplies an electric signal to the semiconductor light modulation device 1, and the electric signal varies the applied electric field. Then, the light absorbing/transmission layer 1a changes the absorbance around the wavelength at the absorption edge, and transfers an incident light to the opposite end as a transmission light different in intensity from the incident light.

If the light absorbing/transmitting layer 1a is a semiconductor bulk, the light absorption is carried out through the Franz-Kaldysh effect. When an electric field takes place in the light absorbing/transmitting layer 1a, the light absorption spectrum is changed from Plots AB1 to AB2 as shown in FIG. 2. Broken line BR1 is indicative of the modulation wavelength.

On the other hand, if the light absorbing/transmitting layer 1a is a semiconductor super-lattice layer, the light absorption is carried out through the Stark effect. When an electric field takes place in the light absorbing/transmitting layer 1a, the light absorption spectrum is changed from Plots AB3 to Plots AB4 as shown in FIG. 3.

Thus, the light absorbance is controllable with the electric field, and the intensity of light is modulated by changing the electric field in the light absorbing/transmitting layer 1a.

A typical example of the semiconductor light modulation device 2 of the electro-refraction type is illustrated in FIG. 4, and the semiconductor light modulation device 2 serves as a directional coupler. The semiconductor light modulation device 2 has two wave guides 2a and 2b close to each other such that an optical coupling takes place therebetween, and light modulation layers 2c and 2d of intrinsic semiconductor material are respectively incorporated in the wave guides 2a and 2b.

In operation, an electric signal causes the wave guides 2a and 2b to change an electric field, and the refractive index is varied depending upon the electric field. The variation in refractive index results in change of the optical coupling. As a result, the transmission light is modulated in intensity by changing the applied voltage as shown in FIG. 5.

Attractive features of the semiconductor light modulation device are low power consumption, high-speed response and large extinction ratio.

On the other hand, the semiconductor tunable laser device is a basic component of the multiple wavelength communication system. A controller of the system applies voltage to or injects current into a tuning region of the semiconductor tunable laser device for changing the refractive index, and the semiconductor tunable laser device changes the oscillation wavelength.

FIG. 6 illustrates a prior art semiconductor tunable twin guide laser emitting diode 3 which is usually abbreviated as "TTG-LD". The semiconductor tunable twin guide laser emitting diode comprises a tuning region 3a and an oscillation region 3b, and an active layer 3c and a tuning layer 3d are incorporated therein. A typical example of the semiconductor tunable twin guide laser emitting diode is disclosed in "Novel Tunable Twin Guide Laser Diodes with Carrier Control Tuning Layer", Proceedings of Spring Conference of 1993 Electro-Information Communication Society, page 4–202.

In operation, when current is supplied to the tuning layer 3d, the refractive index is varied due to a plasma effect of carriers, and plot 3e in FIG. 7 is indicative of an optical field distribution created in the semiconductor tunable twin guide laser emitting diode. In FIG. 7, the edge of the conduction band and the edge of the valence band are labeled with Ec and Ev, respectively. A recombination 3f takes place, and a laser light 3g is emitted from the active layer 3c. Thus, the tuning layer 3d changes the oscillation wavelength, and the laser light 3f is variable by changing the current flowing into the tuning layer 3d.

In order to use the semiconductor tunable laser emitting diode in an optical communication system, the tuning layer 3d is expected to widely change the refractive index and to be formed of a low-loss material.

The prior art semiconductor optical devices thus arranged have respective problems as follows.

First, it is important for the electro-absorption type light modulator to be low in power consumption and large in extinction ratio, and the light absorbing/transmission layer 1a is expected to widely vary the absorbance in terms of the electric field under the electric field effect. The Franz-Keldysh effect is available for the semiconductor bulk layer incorporated in the light modulator as described in conjunction with figure 2, and the Stark effect is used for the a type-I super-lattice semiconductor layer incorporated in the light modulator described in conjunction with FIG. 3. The type-I super-lattice structure is formed by two semiconductor materials which have the respective electron affinities chi-1 and chi-2 and the respective energy band gaps Eg1 and Eg2 satisfying the following inequalities.

chi-1<chi-2 chi-1+Eg1>chi-2+Eg2

Both effects shift the wavelength at the absorption edge to become longer under electric field, and this phenomenon is called "Red-Shift".

However, the Franz-Keldysh effect requires a strong electric field for the red-shift, and the strong electric field is hardly produced in the semiconductor light absorbing/transmitting layer of the semiconductor bulk. A weak electric field can not allow the Franz-Keldysh effect to clearly take place, and the prior art light modulator can not achieve a large extinction ratio.

On the other hand, the Stark effect allows the red-shift to take place under a relatively weak electric field. The Stark effect requires clear exiton characteristics or rapid absorption edge characteristics. However, such rapid absorption edge characteristics have not been realized by using a super-lattice structure available for 1-micron band width typically used for the optical communication system. Moreover, the Stark effect uses a decrease of the transition probability in the super-lattice quantum-well under an electric field due to the polarization of the carrier. However, the actual space polarization of carriers is not wide enough to decrease the transition probability, and the Stark effect is not strong in the type-I super-lattice structure.

Thus, the absorption coefficient can not be widely varied so that the prior art light modulators of the electro-absorption type can not achieve a large extinction ratio.

The prior art light modulator of the electro-refraction type requires the light modulation layer widely variable in refractive index under an electric field, and the light modulation layer is formed by using the type-I super-lattice structure. However, the Stark effect takes place in the type-I super-lattice structure as described hereinbefore, and the incident light is partially absorbed due to the Stark effect. When the light is absorbed, photo-carriers are produced, and the photo-carriers do not allow the light modulator to promptly modulate the incident light by using the electric signal. Moreover, the power consumption is increased, and the extinction ratio becomes small.

Finally, the prior art semiconductor tunable laser emitting device requires the tuning layer widely variable in refractive index by enlarging the carrier density distribution, and the type-I super-lattice is suitable rather than a semiconductor bulk layer. For this reason, the tuning layer is usually formed by the type-I super-lattice structure. However, the distribution probability of electron is three-dimensionally overlapped with the distribution probability of hole in the type-I super-lattice structure, and the type-I super-lattice structure tends to allow the electron to recombine with the hole. This results in decrease of the carrier density, and the variation in refractive index is relatively small. For this reason, the prior art semiconductor tunable laser emitting diode can not widely change the wavelength of the laser beam.

In short, the prior art semiconductor optical devices such as the light modulator and the tunable laser emitting diode require the light controlling layers of the type-I super-lattice structure, i.e., the light absorbing/transmitting layer/the light modulation layer/the tuning layer for changing the intensity or the wavelength of the output light, and the light controlling layers of the type-I super-lattice structure can not satisfy the basic requirements expected to the optical device available for the optical communication system.

SUMMARY OF THE INVENTION

It is therefore an important object of the present invention to provide a semiconductor optical device which is free from the problem inherent in the prior art semiconductor optical devices.

To accomplish the object, the present invention proposes to form a light controlling layer implemented by a type-II super-lattice structure where a first electron affinity and the top edge of the valence band of a first compound semiconductor are smaller than the electron affinity and the top edge of the valence band of a second compound semiconductor, respectively.

In accordance with the present invention, there is provided a semiconductor optical device outputting a variable light beam, comprising: a) a substrate; b) a light controlling layer formed over the substrate, and responsive to an electric field for varying the light beam, the controlling layer having a super-lattice structure formed by using a first compound semiconductor material and a second compound semiconductor material, the first compound semiconductor material having a first electron affinity and a first energy band gap, the second compound semiconductor material having a second electron affinity larger than the first electron affinity and a second energy band gap, the total of the second electron affinity and the second energy band gap being larger than the total of the first electron affinity and the first energy band gap; and c) an electrode structure for varying the electric field.

The semiconductor optical device may be one of a light modulator of the electro-absorbing type, a light modulator of the electro-refraction type and a tunable laser emitting diode.

BRIEF DESCRIPTION OF THE DRAWINGS

The feature and advantages of the semiconductor optical device according to the present invention will be more clearly understood from the following description taken in conjunction with the accompanying drawings in which.

DESCRIPTION OF THE PREFERRED EMBODIMENT

Super-Lattice Structure Used in Optical Device

Figure 1:
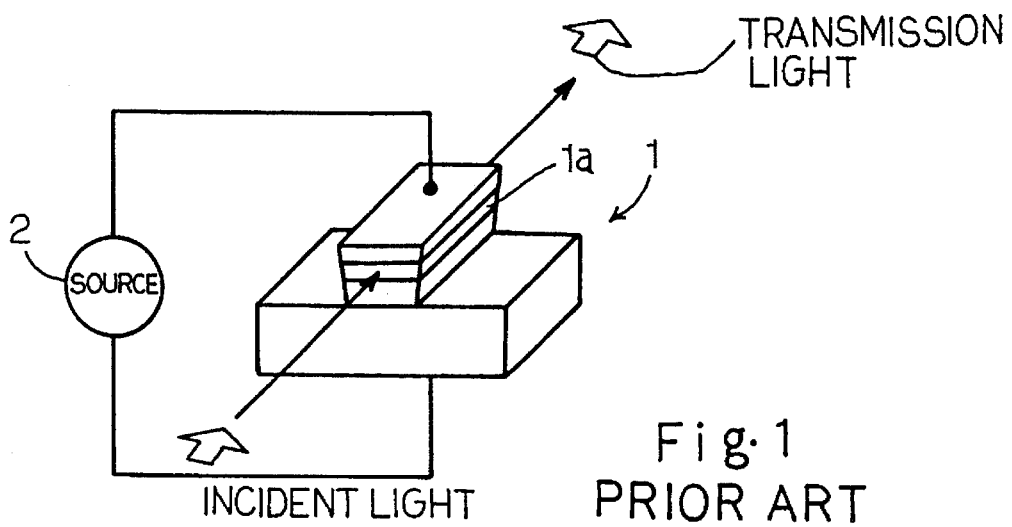
FIG. 1 is a perspective view showing the prior art light modulator of the electro-absorbing type.
Figure 2:
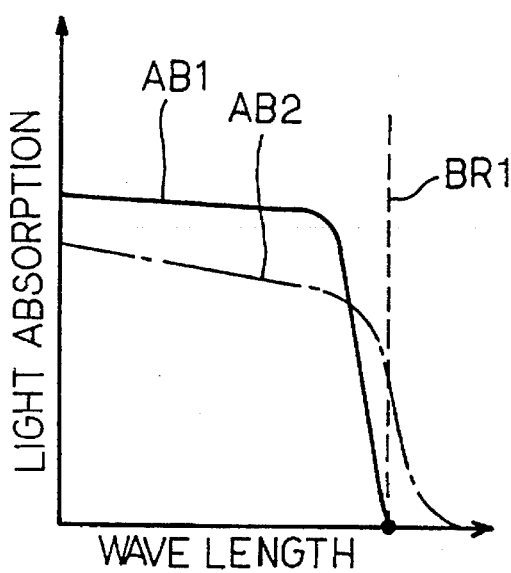
FIG. 2 is a graph showing the light absorption spectrum in terms of the wavelength achieved by the prior art electro-absorbing type light modulator using the light-absorbing/transmitting layer formed of the semiconductor bulk.
Figure 3:
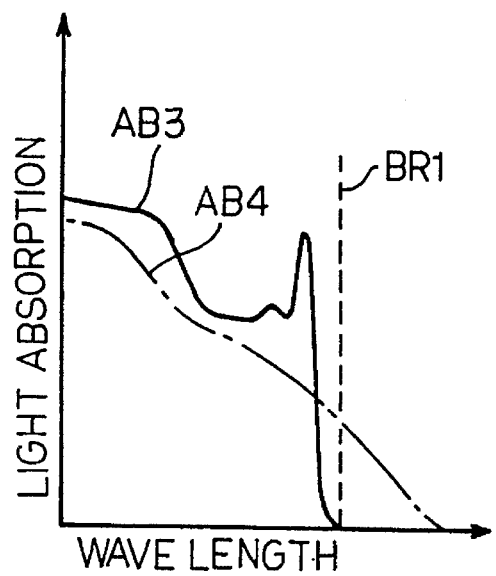
FIG. 3 is a graph showing the light absorption spectrum in terms of the wavelength achieved by the prior art electro-absorbing type light modulator using the light absorbing/transmitting layer formed of the type-I super-lattice structure.
Figure 4:
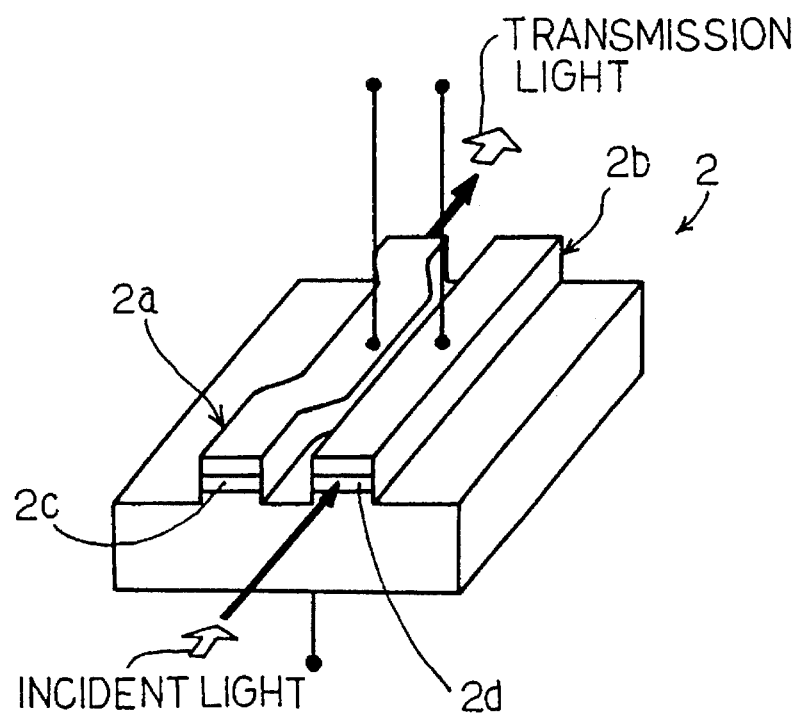
FIG. 4 is a perspective view showing the structure of the prior art light modulator of the electro-refraction type.
Figure 5:
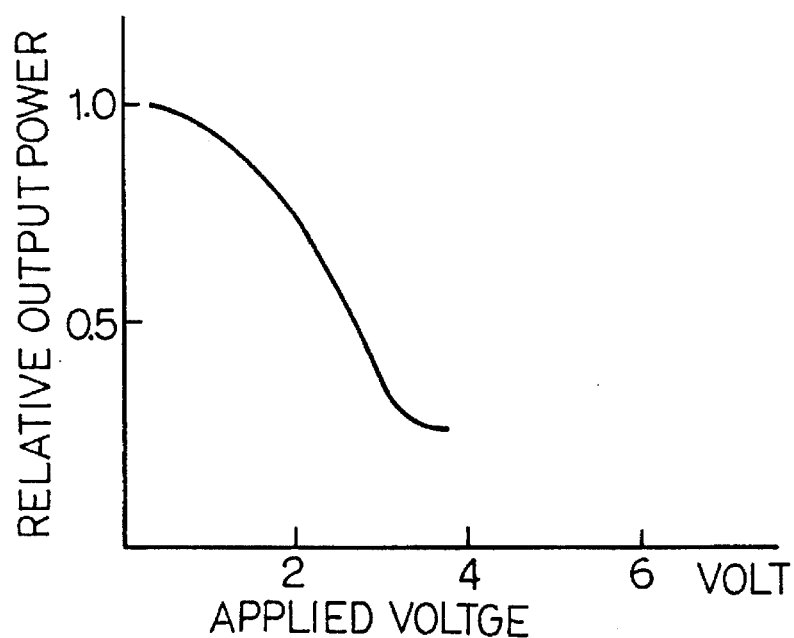
FIG. 5 is a graph showing the relation between the relative output power and the applied voltage achieved by the prior art light modulator of the electro-refraction type.
Figure 6:
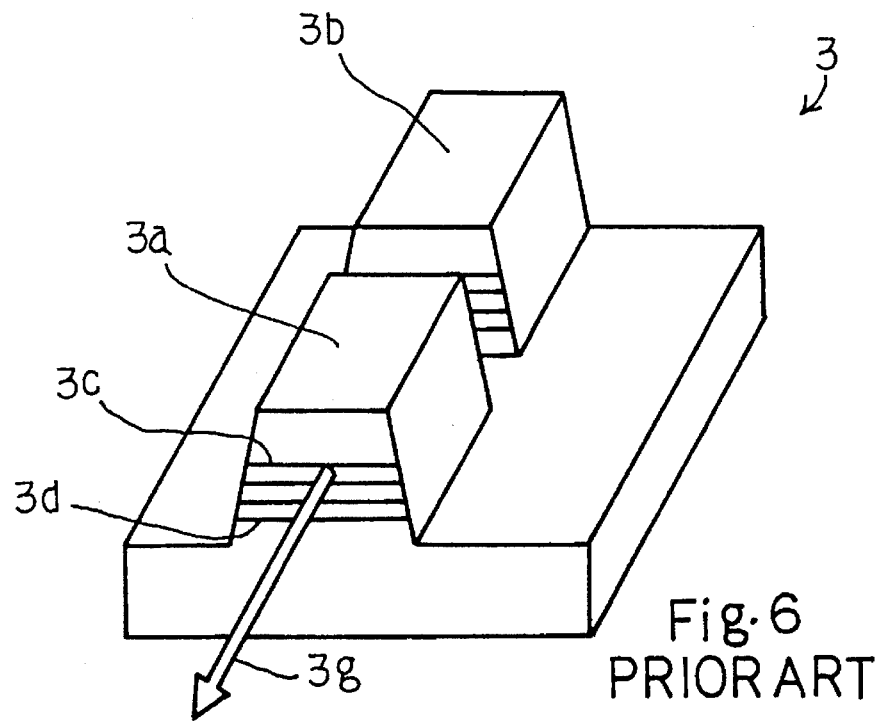
FIG. 6 is a perspective view showing the structure of the prior art semiconductor tunable laser emitting diode.
Figure 7:
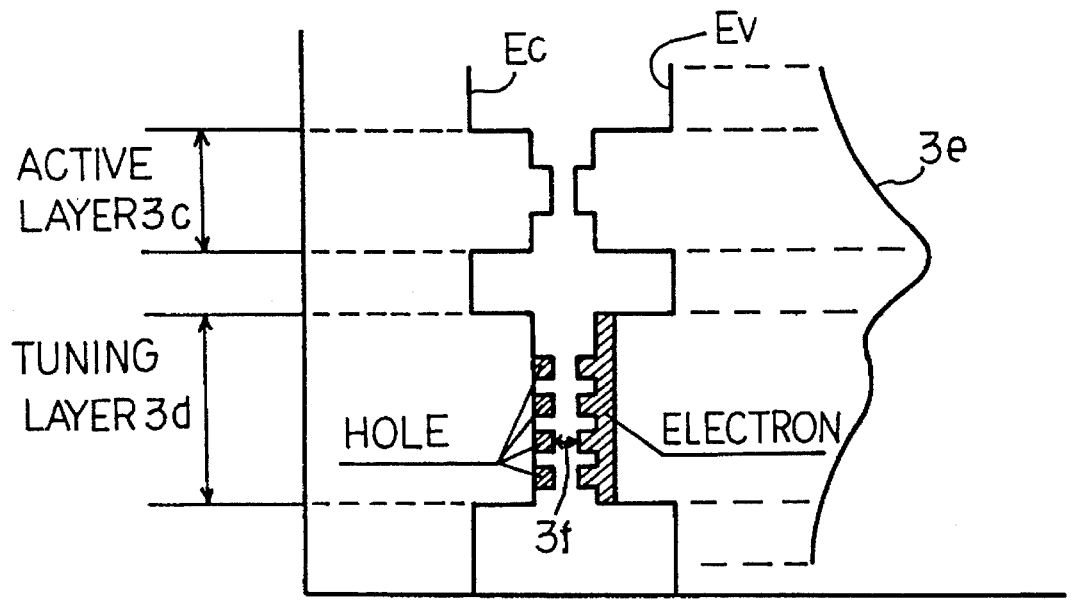
FIG. 7 is a graph showing the energy band and the optical distribution produced in the prior art semiconductor tunable laser emitting diode.
Figure 8:
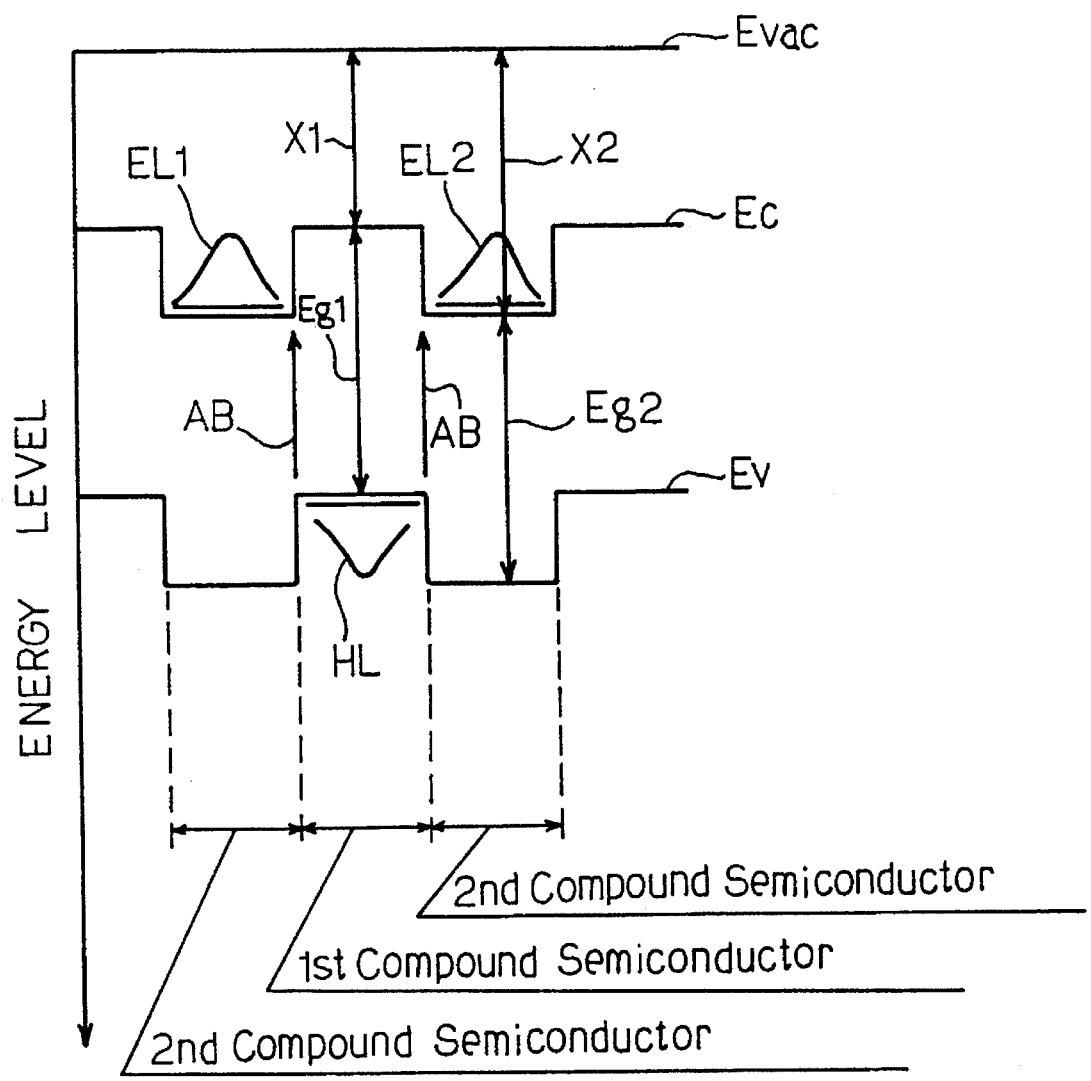
FIG. 8 is a diagram showing the energy band created in a super-lattice incorporated in an optical device according to the present invention.

Referring to FIG. 8 of the drawings, an energy band is created in a super-lattice structure embodying the present invention in thermal equilibrium, and the super-lattice structure is implemented by a first layer of first compound semiconductor material sandwiched between second layers of second compound semiconductor. Evac, Ec and Ev are indicative of the vacuum level, the bottom edge of the conduction band, the top edge of the valence band, respectively. EL1 and EL2 represent electron distributions in the conduction bands of the second compound semiconductor material, and HL is representative of a hole distribution in the valence band of the first compound semiconductor material. Comparing plots EL1 and EL2 with plots HL, it is understood that the electron distributions are perfectly spaced from the hole distribution, and the absorption AB is carried out around the hetero-junction between the first layer of the first compound semiconductor material and the second layers of the second compound semiconductor material.

The first compound semiconductor material has the electron affinity chi-1 and the energy band gap Eg1, and the second compound semiconductor material has the electron affinity chi-2 and the energy band gap Eg2. As will be understood from FIG. 8, the electron affinity chi-2 is larger than the electron affinity chi-1, and the top edge of the valence band of the second compound semiconductor material is widely spaced from the vacuum level Evac rather than the top edge of the valence band. In other words, the total of the electron affinity chi-2 and the energy band gap Eg2 is larger than the total of the electron affinity chi-1 and the energy band gap Eg1. This energy structure is different from that of the type-I super-lattice, and is hereinbelow called as "Type-II Super-Lattice Structure".

In the thermal equilibrium or non-electric field, the light absorption takes place around the minimum energy band gap, i.e., the hetero-junctions between the first layer of the first compound semiconductor material and the second layers of the second compound semiconductor material. However, the transition probability is extremely small, because the electron distributions EL1 and EL2 are spaced from the hole distribution. This means that the absorption characteristics is closed to the indirect transition.

Figure 9:
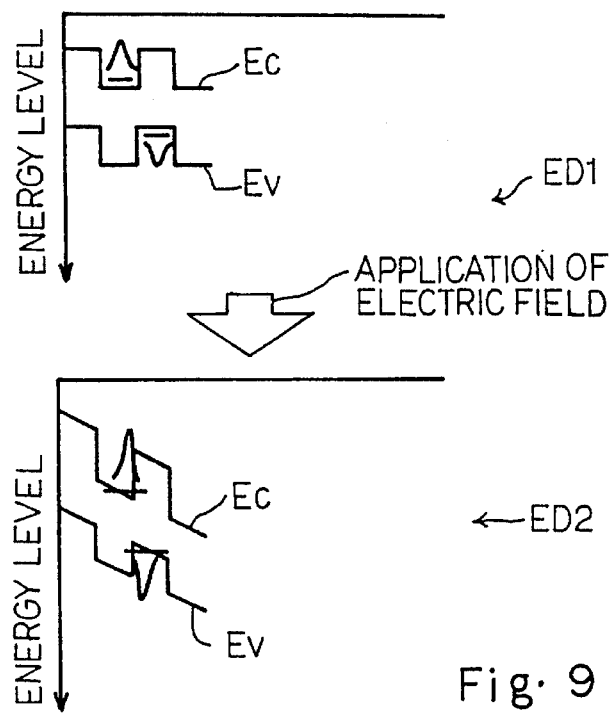
FIG. 9 is a view showing the transition of the energy band diagram under application of an electric field.
Figure 10:
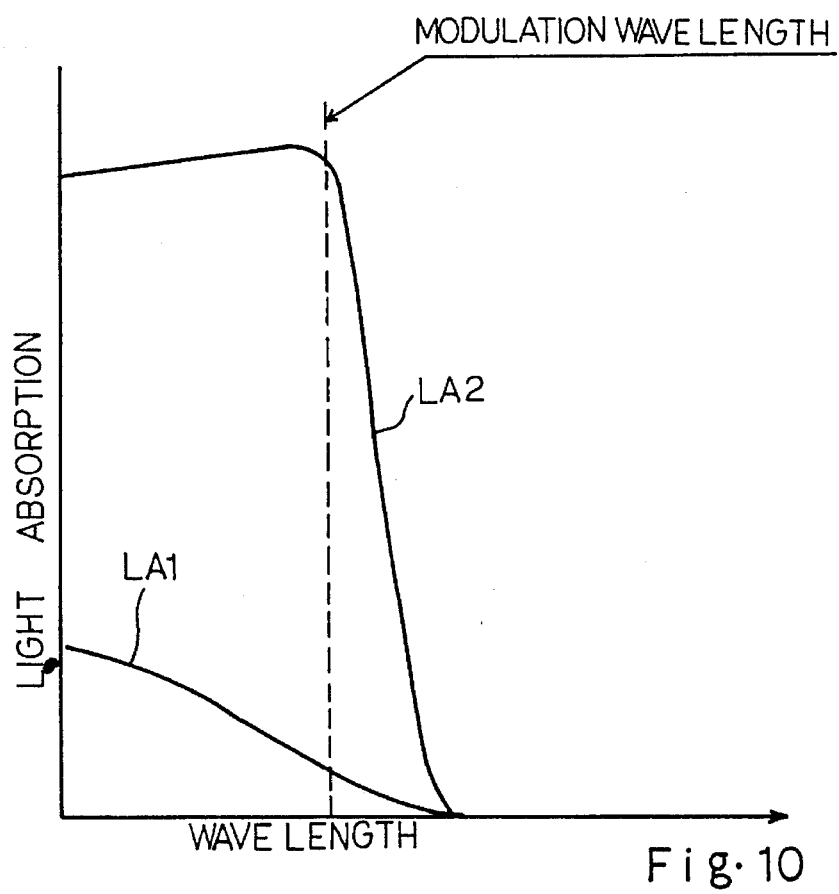
FIG. 10 is a graph showing the light absorption characteristics of the super-lattice structure between the thermal equilibrium and application of the electric field.

However, if an electric field is created in the super-lattice structure, the energy band is deformed from ED1 to ED2 as shown in FIG. 9, and the electron distribution is partially overlapped with the hole distribution. As a result, the transition probability is increased, and the absorption characteristics become close to the direct transition. The light absorption is increased at the modulated wavelength from plots LA1 to plots LA2 (see FIG. 10).

Thus, the type-II super-lattice structure according to the present invention widely changes the light absorption characteristics between .the thermal equilibrium and an application of electric field, and the exiton characteristics for the Stark effect are not required for the type-II super-lattice structure.

Figure 11:
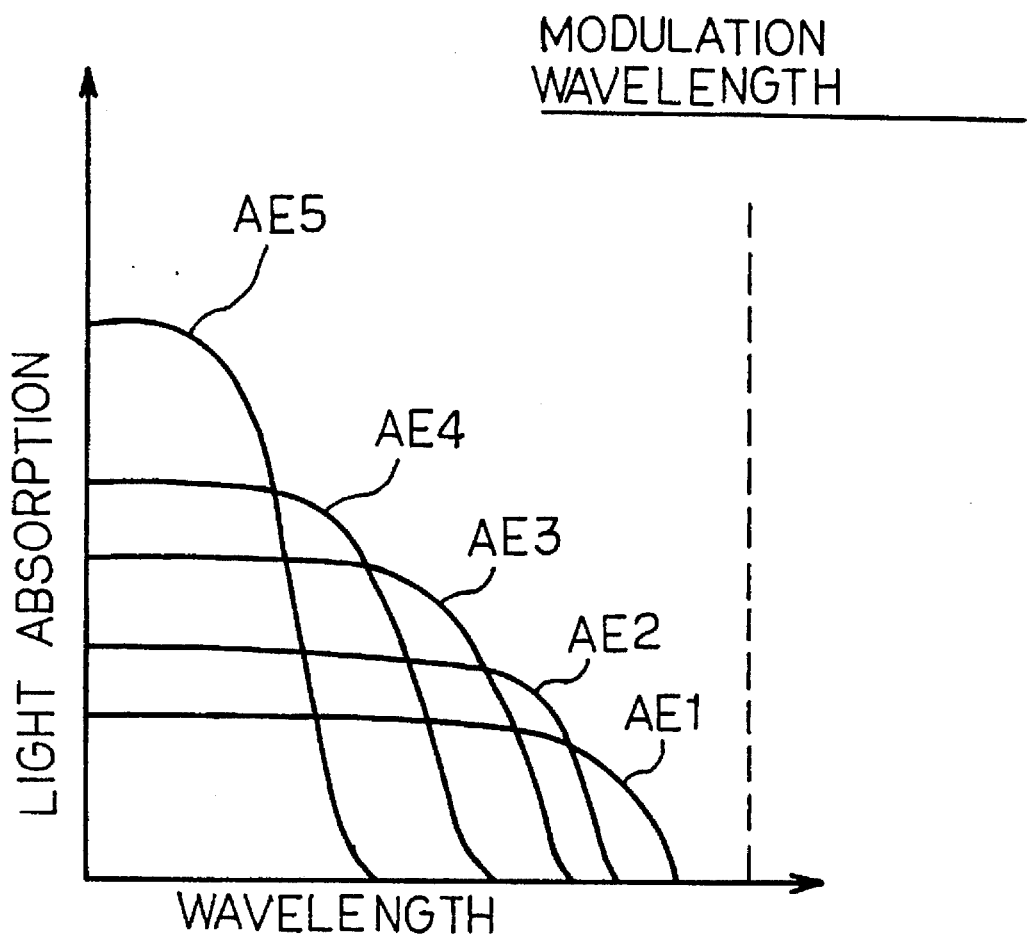
FIG. 11 is a graph showing a blue shift in another super-lattice structure according to the present invention.

FIG. 11 illustrates the absorption characteristics of another type-II super-lattice structure in terms of an electric field applied thereto. Although the absorption takes place at the minimum energy band gap around the hetero-junction between the first layer and the second layers without electric field, the electron space distribution is partially overlapped with the hole space distribution under the application of an electric field, and the absorption edge is shifted toward a short wavelength as indicated by AE1, AE2, AE3, AE4, AE5 ... in FIG. 11. In other words, when the electric field EF1 is increased, a blue shift takes place for the absorption edge, and the modulation wavelength becomes farther from the absorption edge AE1, AE2, AE3, AE4, AE5 under a stronger electric field. The blue shift is opposite to the red-shift in the type-I super-lattice structure, and prevents the super-lattice structure light absorption due the Stark effect or the red-shift. Thus, the type-II super-lattice structure is free from the photo-carriers due to the light absorption, and can promptly respond to the electric field.

Figure 12A:
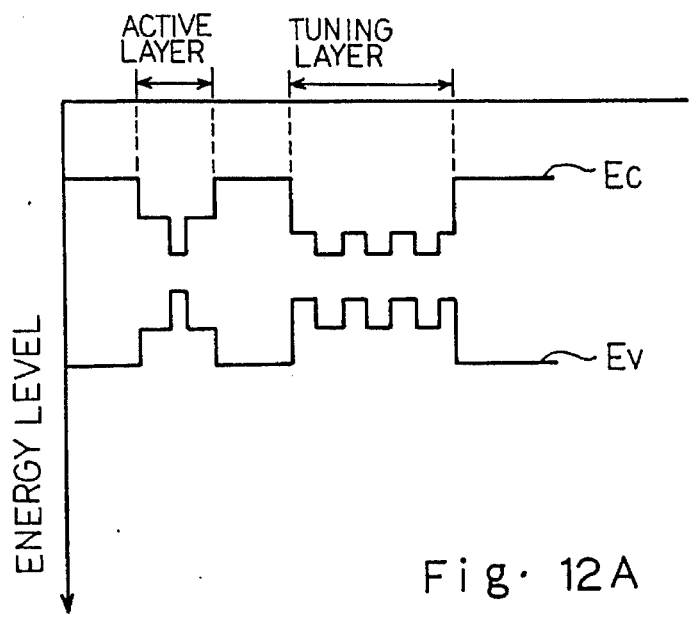
FIG. 12A is a diagram showing the energy band created in yet another super-lattice structure according to the present invention without current.
Figure 12B:
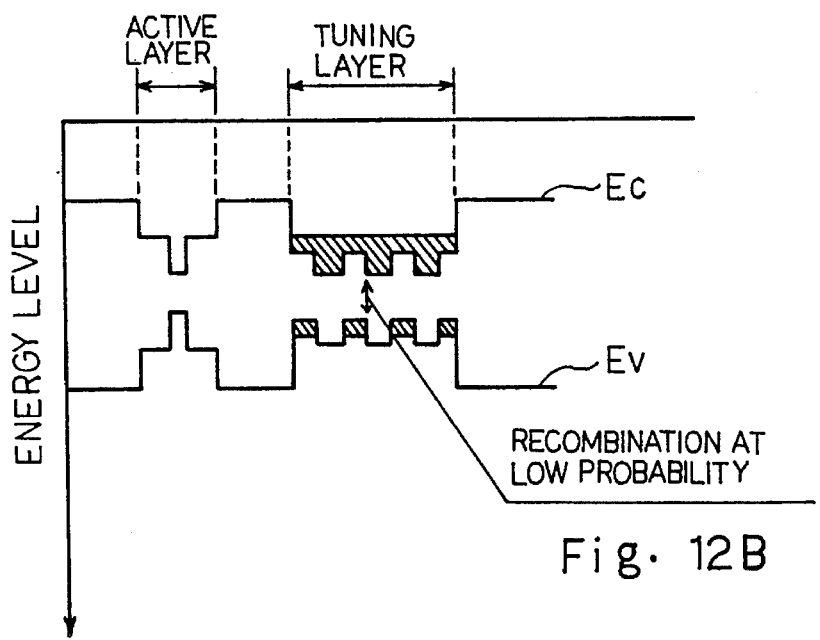
FIG. 12B is a diagram showing the energy band of the super-lattice structure when current flows thereinto.

FIGS. 12A and 12B are energy band diagrams for yet another type-II super-lattice structure embodying the present invention, and the type-II super-lattice structure serves as a tuning layer associated with an active layer. Ec and Ev are also indicative of the bottom edge of the conduction band and the top edge of the valence band, respectively.

FIG. 12A shows the energy band while no current flows into the tuning layer. If the current flows into the tuning layer, the tuning layer increases the carrier densities as indicated by latched lines in FIG. 12B, and the super-lattice structure is expected to change the refractive index. However, the electrons are spaced from the holes, and the probability of the recombination therebetween is extremely low. For this reason, the type-II super-lattice structure is free from the decrease of the carrier densities due to the recombination inherent in the type-I super-lattice structure. As a result, the type-II super-lattice structure can widely vary the wavelength without the recombination.

Device Structures

As described hereinbefore, the type-II super-lattice structure widely changes the light absorption characteristics by controlling the electric field applied thereto rather than either the Franz-Keldysh effect in the semiconductor bulk or the Stark effect in the type-I super-lattice structure. Using the type-II super-lattice structure, various optical devices are fabricated on semiconductor substrates as described hereinbelow.

Figure 13:
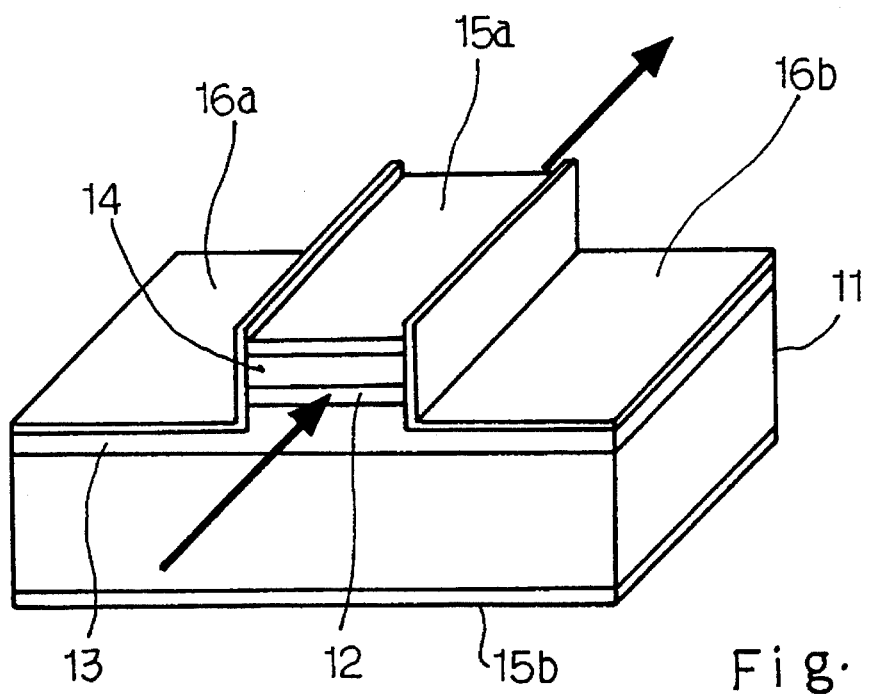
FIG. 13 is a perspective view showing the structure of a semiconductor light modulator of the electro-absorbing type according to the present invention.

FIG. 13 illustrates the structure of a semiconductor light modulator of the electro-absorbing type embodying the present invention. The semiconductor light modulator is fabricated on a substrate 11 of n-type indium phosphide, and comprises a light absorbing/transmitting layer 12 sandwiched between a lower clad layer 13 of n-type indium phosphide and an upper clad layer 14 of p-type indium phosphide. The light absorbing/transmitting layer 12 is implemented by a type-II super-lattice structure which is formed by using n-type indium phosphide and indium aluminum arsenide, and the indium aluminum arsenide and the n-type indium phosphide serve as a first compound semiconductor material and a second compound semiconductor material, respectively, in this instance.

Electrodes 15a and 15b are respectively held in contact with the upper clad layer 14 and the substrate 11, and protection layers of silicon nitride 16a and 16b cover exposed areas of the lower clad layer 13.

The semiconductor light modulator is fabricated through the following process sequence. First, the substrate 11 is prepared, and the n-type indium phosphide layer, the n-type indium phosphide/ indium aluminum arsenide layers and the p-type indium phosphide layer are successively grown on the major surface of the substrate 11. The laminated layers are partially etched away for forming it into a mesa structure. The electrodes 15a/15b and the protection layers 16a/16b are formed on the predetermined areas of the mesa structure.

Figure 14:
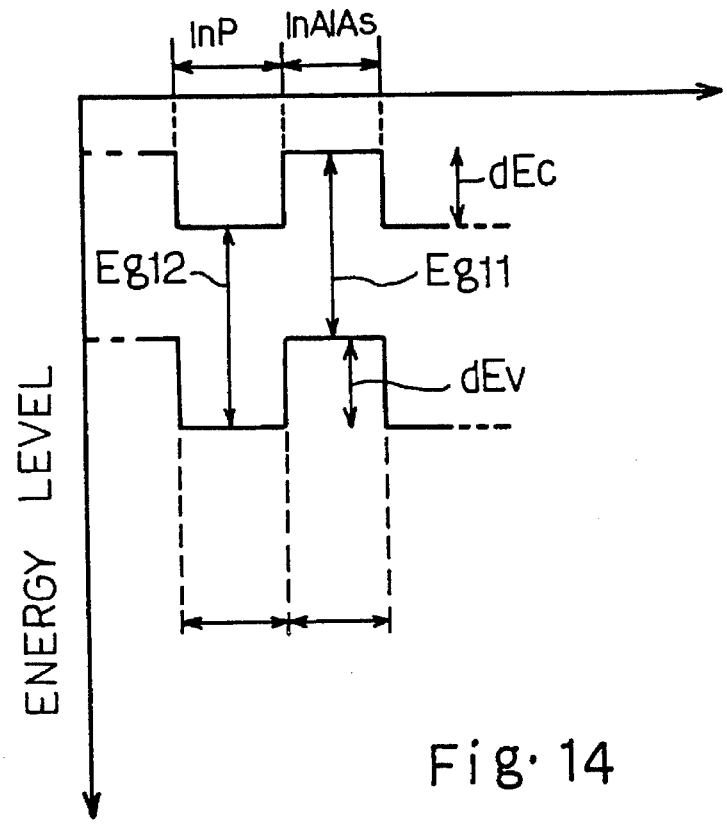
FIG. 14 is a diagram showing the energy band created in a light absorbing/transmitting layer incorporated in the semiconductor light modulator shown in FIG. 13.

The super-lattice Structure has 30 pairs of n-type indium phosphide layer/indium aluminum arsenide layer, and the n-type indium phosphide layer and the indium aluminum arsenide layer are 70 angstroms thick and 70 angstroms thick, respectively, and the energy band takes place in the super-lattice structure as shown in FIG. 14. The indium aluminum arsenide has the energy band gap Eg11 of 1.49 eV, and the n-type indium phosphide has the energy band gap Eg12 of 1.37 eV. For this reason, a potential discontinuity dec of 0.38 eV takes place between the bottom edges of the conduction bands, and a potential discontinuity dEv of 0.26 eV takes place between the top edges of the valence bands.

The present inventor confirmed the switching characteristics of the light modulator. An incident light with wavelength of 1125 nanometers fell upon the light absorbing/transmitting layer 12, and the potential applied to the electrodes 15a and 15b was varied. The incident light was close to the absorption edge of the light absorbing/transmitting layer 12. The intensity of the transmission light was measured, and was plotted as a relative value as shown in FIG. 15.

Figure 15:
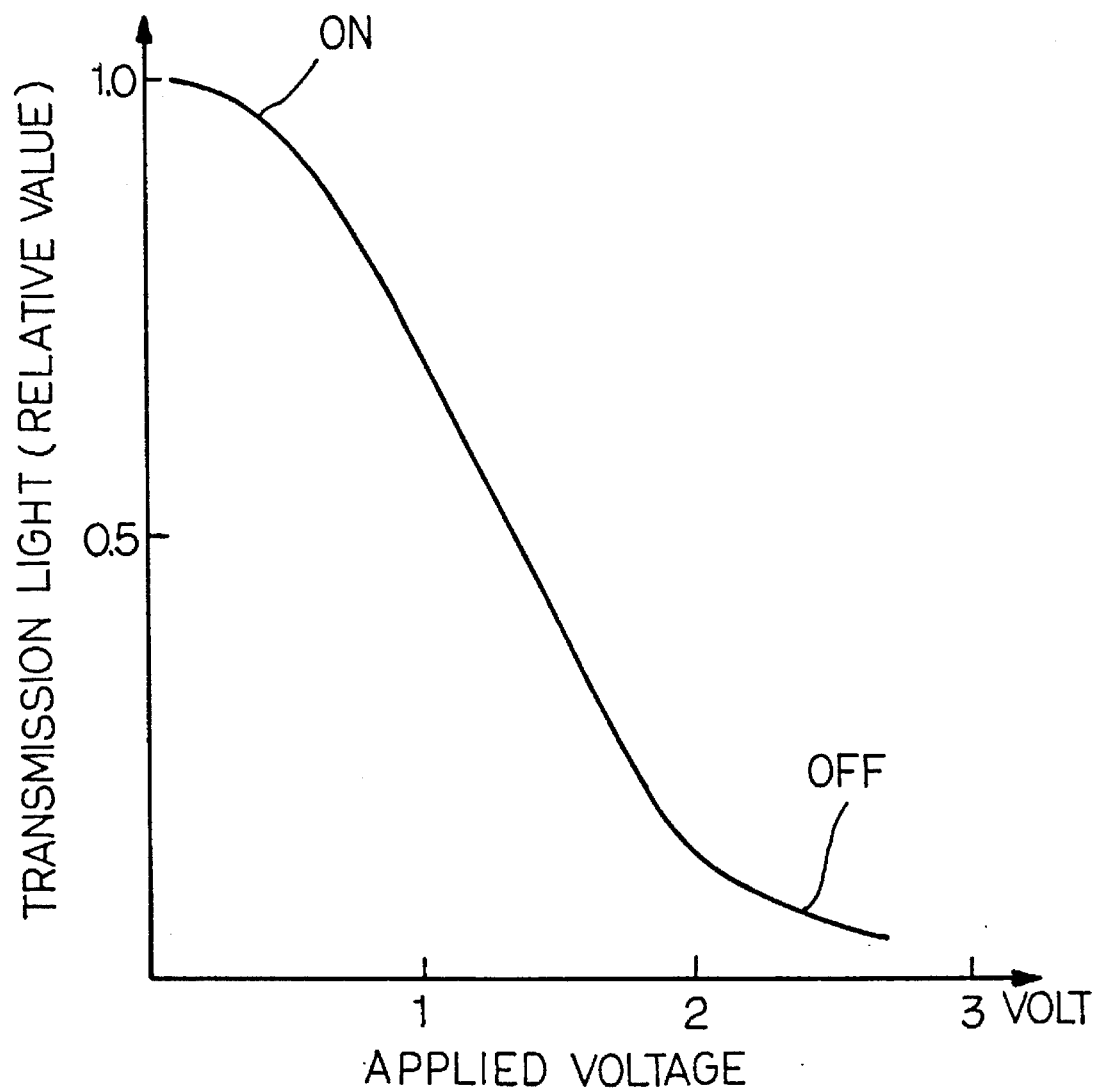
FIG. 15 is a graph showing the absorption characteristics in terms of voltage applied to the light absorbing/transmitting layer.

As will be understood from FIG. 15, the transmission light was effectively modulated with the electric field created by using the potential between the electrodes 15a and 15b, and the light modulator embodying the present invention achieved a large extinction ratio.

Figure 16:
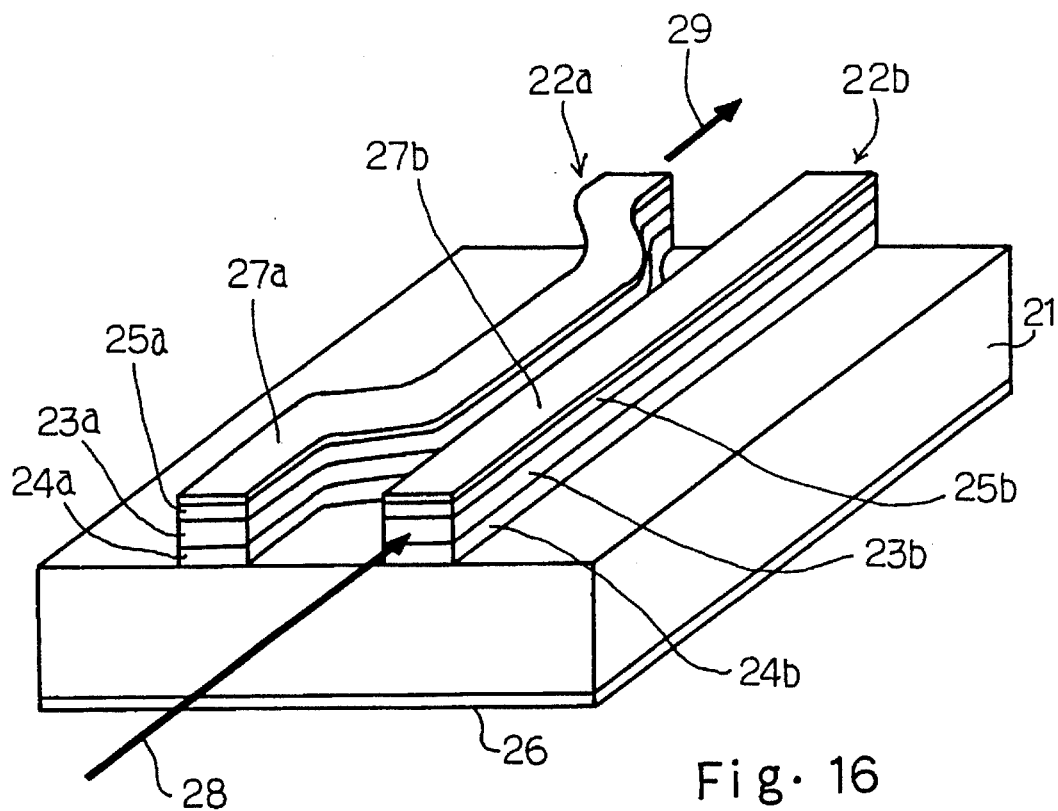
FIG. 16 is a perspective view showing the structure of a light modulator of the electro-refraction type according to the present invention.

Turning to FIG. 16 of the drawings, a semiconductor light modulator of the electro-refraction type embodying the present invention is fabricated on a substrate 21 of n-type indium phosphide, and two wave guides 22a and 22b are formed on the major surface of the substrate 21. The wave guide 22a is bent toward the wave guide 22b, and the wave guides 22a and 22b are partially as close as the optical coupling takes place therebetween.

The wave guide 22a comprises a light transmitting layer 23a sandwiched between a lower clad layer 24a of n-type indium phosphide and an upper clad layer 25a of p-type indium phosphide, and the other wave guide 22b also comprises a light transmitting layer 23b sandwiched between a lower clad layer 24b of n-type indium phosphide and an upper clad layer 25b of p-type indium phosphide.

A lower electrode 26 is held in contact with the back surface of the substrate 21 and upper electrodes 27a and 27b are respectively held in contact with the upper clad layers 25a and 25b for applying variable voltage to the light transmitting layers 23a and 23b.

Figure 17:
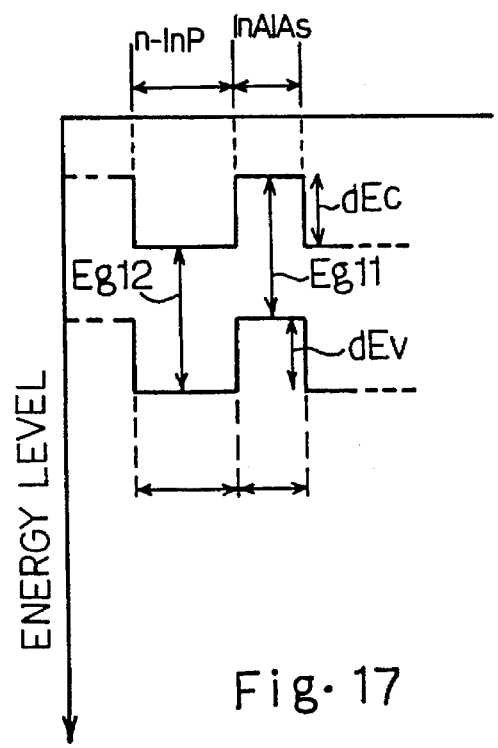
FIG. 17 is a diagram showing the energy band created in the type-II super-lattice structure incorporated in the light modulator shown in FIG. 16.

Each of the light transmitting layers 23a and 23b is implemented by the type-II super-lattice structure, and 30 pairs of n-type indium phosphide layer and indium aluminum arsenide layer are incorporated in the type-II super-lattice structure. As a result, the energy band shown in FIG. 17 is created in the type-II super-lattice structure. In this instance, the indium aluminum arsenide and the n-type indium phosphide serve as a first compound semiconductor material and a second compound semiconductor material, respectively, and the energy band gaps Eg11 and Eg12 and the potential discontinuities dEc and dEv take place in the type-II super-lattice structure as similar to that of the super-lattice structure 12. The light transmitting layers 23a and 23b have an absorption edge around 1100 nanometers.

Figure 18:
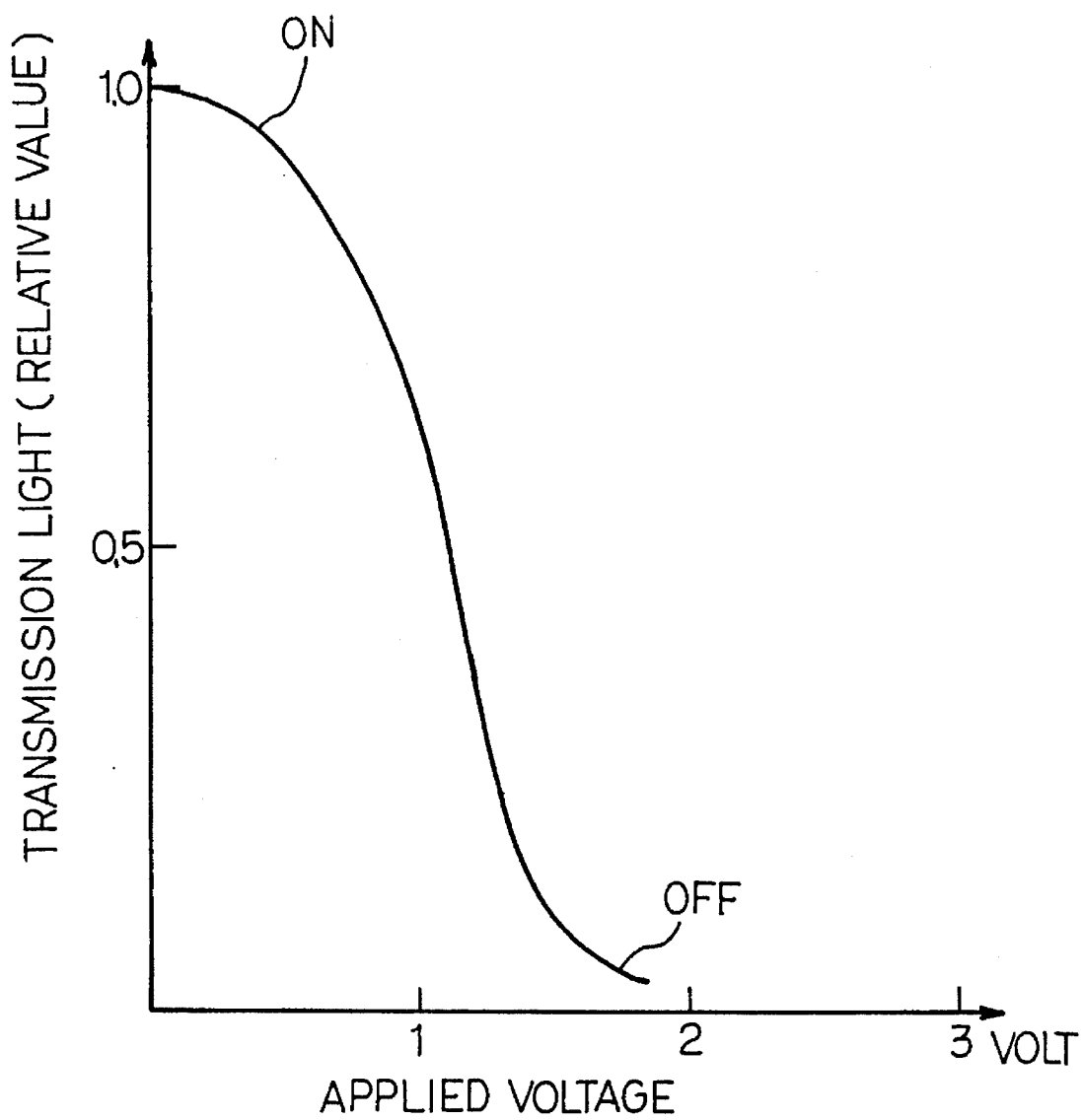
FIG. 18 is a graph showing the transmitting characteristics in terms of the applied voltage.

An incident light 28 with wavelength of 1.3 micron band was radiated to the light transmitting layer 23b, and the potential between the lower electrode 26 and the upper electrodes 27a/27b was varied. When the applied voltage was changed, the intensity of the transmission light 29 was widely varied, and was plotted as shown in FIG. 18, and a large extinction ratio was confirmed, because the light coupling effectively takes place between the light transmitting layers 23a and 23b. Moreover, the switching characteristics was improved, and the type-II super-lattice structure was confirmed to be effective against photo-carriers due to the light absorption.

Although the light modulator serves as a directional coupler, a Mach-Zehnder type light modulator is also obtained by using the type-II super-lattice structure.

Figure 19:
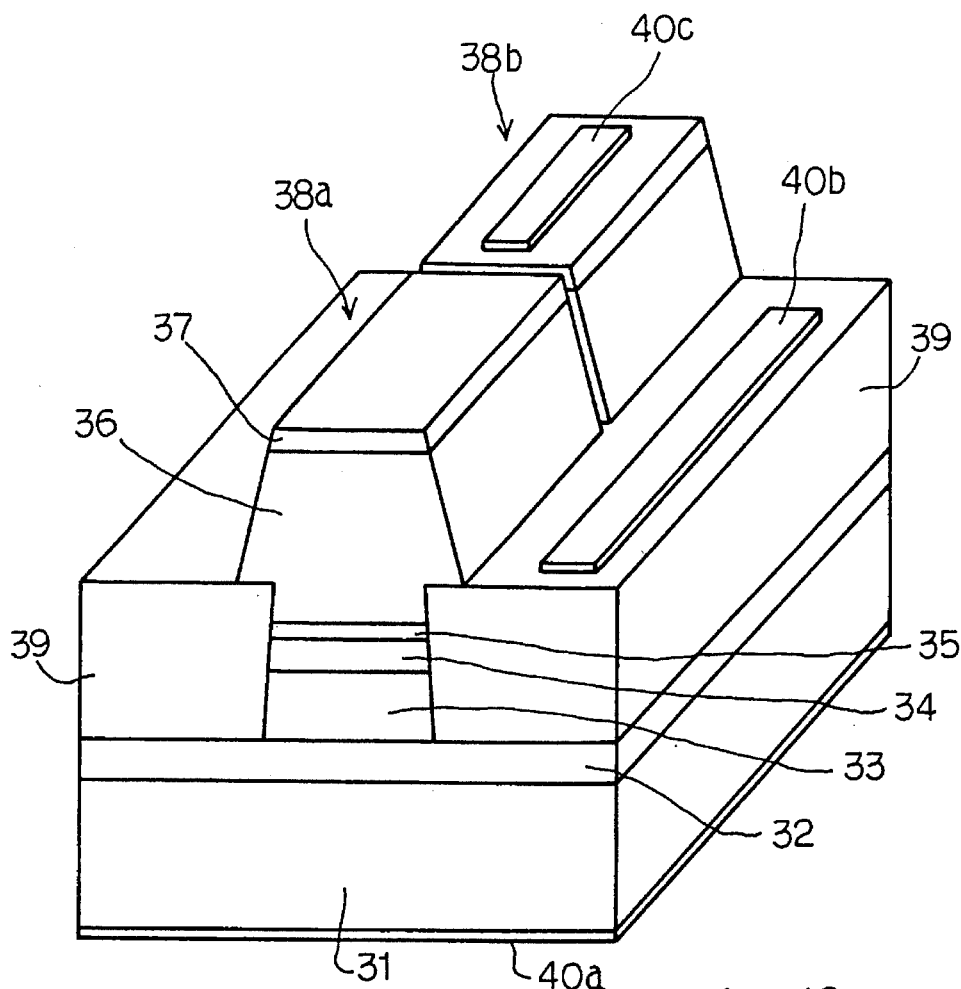
FIG. 19 is a perspective view showing the structure of a tunable laser emitting diode according to the present invention.

Turning to FIG. 19, a semiconductor tunable laser emitting diode embodying the present invention is fabricated on a substrate 31 of p-type indium phosphide, and comprises a buffer layer 32 of p-type indium phosphide, a tuning layer 33 implemented by the type-II super-lattice structure, a lower clad layer 34 of n-type indium phosphide, an active layer 35 of n-type indium phosphide and indium gallium arsenide, an upper clad layer 36 of p-type indium phosphide and a contact layer 37 of p-type indium gallium arsenide. A gap separates the laminated structure, and a tuning region 38a and an oscillation region 38b are formed as shown. Buried layers 39 of n-type indium phosphide are formed on both sides of the tuning and oscillation regions 38a and 38b. Electrodes 40a, 40b and 40c are formed on the back surface of the substrate 31, the upper surface of the buried layer 39 and the upper surface of the contact layer of the oscillation region 38b, respectively.

Figure 20:
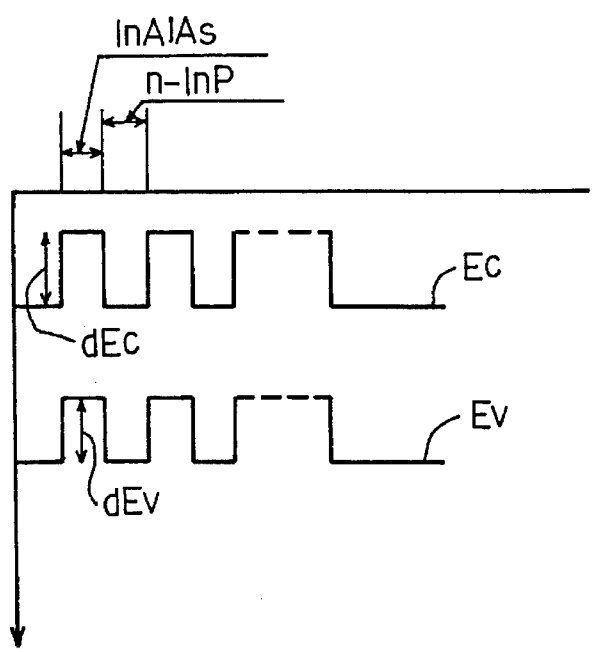
FIG. 20 is a diagram showing the energy band created in the tuning layer incorporated in the tunable laser emitting diode.

The type-II super-lattice structure of the tuning layer 33 is formed by 30 pairs of n-type indium phosphide layer and indium aluminum arsenide layer, and each of the n-type indium phosphide layer and the indium aluminum arsenide layer is about 70 angstroms thick. The energy band shown in FIG. 20 is created in the type-II super-lattice structure, and the potential discontinuities dEc and dEv take place between the bottom edges of the conduction bands and the top edges of the valence bands. The potential discontinuities dEc and dEv are 0.38 eV and 0.26 eV, respectively.

In operation, currents injected into the tuning region 38a and the oscillation region 38b are respectively controlled, and the tunable laser emitting diode changes the wavelength of the laser beam. The present inventor confirmed that the variation of the wavelength is three times wider than that of the prior art tunable laser emitting diode using the type-I super-lattice structure.

As will be appreciated from the foregoing description, the optical devices according to the present invention are operable under a relatively weak electric field, and achieve a large extinction ratio. Moreover, a wide variation of the wavelength of the emitted laser light.

Although particular embodiments of the present invention have been shown and described, it will be obvious to those skilled in the art that various changes and modifications may be made without departing from the spirit and scope of the present invention. For example, the type-II super-lattice structure is created in the indium phosphide/indium aluminum arsenide system. However, the type-II super-lattice structure may be created in the InGaAsP/InGaAlAs system and in the InGaAlAs/GaAlAsSb system.

What is claimed is:

1. A semiconductor light modulator of an electro-reflection type for controlling the intensity of an incident light, comprising:

a) a substrate;

b) a first wave guide having a first light transmitting layer implemented by a super-lattice structure formed by using a first compound semiconductor material and a second compound semiconductor material, said incident light being radiated into said first light transmitting layer for modulating the intensity thereof, said first compound semiconductor material having a first electron affinity and a first energy band gap, said second compound semiconductor material having a second electron affinity larger than said first electron affinity and a second energy band gap, the total of said second electron affinity and said second energy band gap being larger than the total of said first electron affinity and said first energy band gap;

c) a second wave guide having a second light transmitting layer implemented by the super-lattice structure formed by using said first compound semiconductor material and said second compound semiconductor material, and said incident light being transferred from said first light transmitting layer to said second light transmitting layer for emitting a modulated light to the outside thereof under a light coupling; and d) a pair of electrodes operative to apply a variable voltage to said first and second light transmitting layers for controlling the light coupling between said first light transmitting layer and said second light transmitting layer.

2. The semiconductor light modulator as set forth in claim 1, in which said first compound semiconductor material and said second compound semiconductor material are indium aluminum arsenide and n-type indium phosphide, respectively.

3. The semiconductor light modulator as set forth in claim 2, in which each of said first compound semiconductor material and said second compound semiconductor material forms a layer of 70 angstroms thick.

4. The semiconductor light modulator as set forth in claim 3, in which each of said first and second light transmitting layers is sandwiched between a lower clad layer and an upper clad layer, said lower clad layer being provided between said substrate and said each of said first and second light transmitting layers, said upper clad layer being provided between said each of said first and second light transmitting layers and one of said electrodes.

5. A semiconductor tunable laser emitting diode for controlling the wavelength of a laser light, comprising:

a) a substrate;

b) a buffer layer formed on said substrate;

c) a tuning layer formed on said buffer layer, and implemented by a super-lattice structure formed by using a first compound semiconductor material and a second compound semiconductor material, said first compound semiconductor material having a first electron affinity and a first energy band gap, said second compound semiconductor material having a second electron affinity larger than said first electron affinity and a second energy band gap, the total of said second electron affinity and said second energy band gap being larger than the total of said first electron affinity and said first energy band gap;

d) a lower clad layer formed on said tuning layer;

e) an active layer formed on said tuning layer for producing said laser light; and f) an electrode structure operative to supply a first current to said active layer for producing said laser light and a second current to said tuning layer for changing a refractive index, thereby modulating the wavelength of said laser light.

6. The semiconductor tunable laser emitting diode as set forth in claim 5, in which said first compound semiconductor material and said second compound semiconductor material are indium aluminum arsenide and n-type indium phosphide, respectively.

7. The semiconductor tunable laser emitting diode as set forth in claim 6, in which each of said first compound semiconductor material and said second compound semiconductor material forms a layer of 70 angstroms thick.

* * * * *

UNITED STATES PATENT AND TRADEMARK OFFICE
CERTIFICATE OF CORRECTION

PATENT NO. : 5,499,259
DATED : March 12, 1996
INVENTOR(S) : Kikuo Makita

It is certified that error appears in the above-indentified patent and that said Letters Patent is hereby corrected as shown below:

Column 1, line 29, delete "Waveguid" and insert --Waveguide--;

line 32, delete "InGa sP" and insert --InGaAsP--.

Signed and Sealed this

Sixth Day of August, 1996

Attest:

BRUCE LEHMAN

Attesting Officer    Commissioner of Patents and Trademarks